United States Patent
Weidlich et al.

(10) Patent No.: US 11,815,580 B2
(45) Date of Patent: Nov. 14, 2023

(54) MRI WITH MATCHING STATES OF VIBRATION

(71) Applicant: KONINKLIJKE PHILIPS N.V., Eindhoven (NL)

(72) Inventors: Dominik Johannes Weidlich, Munich (DE); Stefan Ruschke, Aachen (DE); Dimitrios Karampinos, Unterhaching (DE); Andreas Hock, Rüschlikon (CH)

(73) Assignee: Koninklijke Philips N.V., Eindhoven (NL)

( * ) Notice: Subject to any disclaimer, the term of this patent is extended or adjusted under 35 U.S.C. 154(b) by 124 days.

(21) Appl. No.: 17/606,065

(22) PCT Filed: Apr. 16, 2020

(86) PCT No.: PCT/EP2020/060673
§ 371 (c)(1),
(2) Date: Oct. 25, 2021

(87) PCT Pub. No.: WO2020/216668
PCT Pub. Date: Oct. 29, 2020

(65) Prior Publication Data
US 2022/0196772 A1    Jun. 23, 2022

(30) Foreign Application Priority Data
Apr. 25, 2019 (EP) .................................. 19171084

(51) Int. Cl.
*G01R 33/56* (2006.01)
*G01R 33/563* (2006.01)

(52) U.S. Cl.
CPC ... *G01R 33/5608* (2013.01); *G01R 33/56341* (2013.01)

(58) Field of Classification Search
None
See application file for complete search history.

(56) References Cited

U.S. PATENT DOCUMENTS 6,201,393 B1   3/2001   Bernstein et al.
6,433,550 B1   8/2002   Kinanen
(Continued)

OTHER PUBLICATIONS

Lee Nam Kyung: "Diffusion-weighted imaging of biliopancreatic disorders: Correlation with conventional magnetic resonance imaging", World Journal of Gastroenterology, vol. 18, No. 31, Aug. 21, 2012 (Aug. 21, 2012), pp. 4102-4117, XP093025822.
(Continued)

*Primary Examiner* — Rodney E Fuller

(57) ABSTRACT

A magnetic resonance (MR) system configured to acquire MR data from a subject using a set of waveform and pulse sequence commands to prepare a first state of vibration of the one or more hardware elements and/or the subject. Preparing includes generating the vibration matching gradient inducing the first vibrations of the one or more hardware elements and/or the subject, while the net magnetization vector of the subject is aligned along the longitudinal axis of the main magnetic field. The MR system is configured to acquire the MR data by generating at least two spin manipulating gradients for manipulating phases of nuclear spins within the subject. A vibration matching gradient is used for matching with the first state of vibration with the second state of vibration.

13 Claims, 11 Drawing Sheets

(56) References Cited

U.S. PATENT DOCUMENTS

| | | | |
|---|---|---|---|
| 7,372,265 B2 | 5/2008 | Ham et al. | |
| 2001/0054898 A1 | 12/2001 | Li et al. | |
| 2013/0162249 A1* | 6/2013 | Dietz | G01R 33/4215 |
| | | | 324/318 |
| 2017/0192074 A1* | 7/2017 | Seethamraju | G01R 33/50 |

OTHER PUBLICATIONS

Gallichan Daniel et al: "Addressing a systematic vibration artifact in diffusion-weighted MRI", Human Brain Mapping, Jul. 14, 2009 (Jul. 14, 2009), XP93025717.

Dominik Weidlich et al: "Compensation of signal loss induced by scanner table vibrations in high b-value OW-TSE for measuring lipids ADC", Proceedings of the INternational Society for Magnetic Resonance in Medicine, vol. 27, 3390, Apr. 26, 2019, XP040710776.

Weidlich Dominik et al: "Reduction of vibration-induced signal loss by matching mechanical vibrational states: Application in high b-value diffusion-weighted MRS", Magnetic resonance in medicine, vol. 84, No. 1, Dec. 24, 2019 (Dec. 24, 2019), pp. 39-51, XP093026095.

Hiltunen J, Hari R, Jousmaki V, Muller K, Sepponen R, Joensuu R. "Quantification of mechanical vibration during diffusion tensor imaging at 3 T" Neuroimage 2006;32(1):93-103.

Gallichan D, Robson MD, Bartsch A, Miller KL. "TREMR: Table-resonance elastography with MR" Magn Reson Med 2009,62(3):815-821.

Search Report and Written Opinion from PCT/EP2020/060673 dated Oct. 29, 2020.

* cited by examiner

MRI WITH MATCHING STATES OF VIBRATION

CROSS REFERENCE TO RELATED APPLICATIONS

This application is a U.S. national phase application of International Application No. PCT/EP2020/060673 filed Apr. 16, 2020, which claims the benefit of EP Application Serial No. 19171084.7 filed Apr. 25, 2019 and is incorporated herein by reference.

FIELD OF THE INVENTION

The invention relates to magnetic resonance data acquisition, in particular to a matching of vibration states during magnetic resonance data acquisition.

BACKGROUND OF THE INVENTION

A large static magnetic field is used by Magnetic Resonance (MR) scanners, like, e.g., Magnetic Resonance Imaging (MRI) systems or Magnetic Resonance Spectroscopy (MRS) systems, to generate a net magnetization vector within a subject as part of a procedure for acquiring magnetic resonance data from within the subject. This large static magnetic field is referred to as B0 field or main magnetic field. In addition, magnetic gradient fields and radio frequency pulse waves may be used for introducing spatial and temporal magnetic field variations and excitation of spin resonances which enables the measurement of magnetic resonance data. Analyzing the acquired magnetic resonance data provides a non-invasive method for gaining information about internal structures and/or material compositions of the subject. Various quantities or properties of the subject can thus be measured using MR. Various MR protocols can be implemented defining waveform and pulse sequences to control the acquisition of magnetic resonance data with an MR system. Some MR techniques, e.g., techniques that encode spin displacement-induced phase effects require an application of strong magnetic gradients to the subject.

The U.S. Pat. No. 6,201,393 addresses reducing patient motion due to the patient being startled due to sudden sound. The known magnetic resonance imaging method proposes to avoid the patient being startled by the application of gradient pulses prior to the commencement of an MRI image acquisition. Prior to a new MRI image acquisition the gradient pulses is applied at a low amplitude and is repeated at increasing amplitudes until the sound is substantially the same as that produced during the image acquisition.

SUMMARY OF THE INVENTION

The invention provides for a magnetic resonance imaging system, a computer program product and a method of operating the magnetic resonance imaging system in the independent claims. Embodiments are given in the dependent claims.

In one aspect, the invention relates to a magnetic resonance system configured for acquiring magnetic resonance data from a subject in a data acquisition volume of the magnetic resonance system. The magnetic resonance system comprises a memory storing machine executable instructions and a set of waveform and pulse sequence commands. The set of waveform and pulse sequence commands is configured for generating a vibration matching gradient for inducing first vibrations of one or more hardware elements of the magnetic resonance system and/or the subject. The vibration matching gradient is generated while a net magnetization vector of the subject is aligned along, i.e., parallel or antiparallel to, a longitudinal axis of a main magnetic field generated by the magnetic resonance system.

The set of waveform and pulse sequence commands is further configured for acquiring magnetic resonance data from the subject according to a magnetic resonance protocol. The acquiring of the magnetic resonance data comprises generating in sequence at least two spin manipulating gradients for manipulating phases of nuclear spins within the subject. The at least two spin manipulating gradients are each generated while the net magnetization vector of the subject comprises a non-vanishing component of net magnetization in a transverse plane perpendicular to the longitudinal axis of the main magnetic field.

The magnetic resonance system further comprises a processor for controlling the magnetic resonance system. Execution of the machine executable instructions causes the processor to control the magnetic resonance system using the set of waveform and pulse sequence commands to prepare a first state of vibration of the one or more hardware elements and/or the subject. The preparing comprises generating the vibration matching gradient inducing the first vibrations of the one or more hardware elements and/or the subject, while the net magnetization vector of the subject is aligned along the longitudinal axis of the main magnetic field.

Furthermore, the magnetic resonance data is acquired according to the magnetic resonance protocol. The acquiring comprises generating in sequence the at least two spin manipulating gradients for manipulating phases of nuclear spins within the subject, while the net magnetization vector of the subject comprises a non-vanishing component in the transverse plane perpendicular to the longitudinal axis of the main magnetic field. A first one of the at least two spin manipulating gradients is generated during the first state of vibration and a second one of the at least two spin manipulating gradients is generated during a second state of vibration of the one or more hardware elements and/or the subject. The vibration matching gradient is used for matching with the first state of vibration the second state of vibration.

Embodiments may have the beneficial effect of enabling an efficient compensation of vibrational effects resulting from different states of vibration excited during data acquisition by matching the states of vibration using an additional vibration matching gradient. When a gradient is generated using gradient coils, the gradient coils may cause mechanical vibrations. The mechanical vibration may result in a state of vibration during which a subsequent gradient is generated. This state of vibration may differ from a state of vibration during which the preceding gradient was generated resulting in vibration-induced phase effects contaminating a measured signal. Any pair of gradients with a transverse magnetization component present between them may contaminate the measured signal due to vibration-induced phase effects.

The vibration matching gradient (VMG) is placed before the first spin manipulating gradient with appropriate timing, the tissue displacement pattern can become similar during both diffusion encoding gradients. The VMG is applied before the RF-excitation pulse of the diffusion sensitizing module and does not interfere with the transverse magnetization but solely induces a mechanical vibration state. When the time interval between the VMG and first spin manipulating gradient is equal to the diffusion time, the tissue displacement caused by scanner table vibrations during the two diffusion gradients will be similar. Therefore, the accumulated phase during the diffusion encoding is similar and the occurring signal loss is mitigated. The mechanical vibrational pattern during the two diffusion gradients may become similar for other timings of the VMG.

The present disclosure suggests a compensation of vibrational effects not based on a reduction of vibrations, but rather based on a matching of states of vibration using additional vibrations. For matching a first state of vibration to a second state of vibration, an additional vibration matching gradient is used. The sole purpose of the additional vibration matching gradient may be inducing vibrations in order to prepare a first state of vibration that mimics the second state of vibration. In order to prevent the vibration matching gradient from affecting the phases of nuclear spins in the subject, the vibration matching gradient is generated, while the net magnetization vector is longitudinally orientated, i.e., while no transverse net magnetization is present.

Such a vibration matching gradient may be used for matching states of vibrations of any pair of spin manipulating gradients, which are generated during a presence of at least some transverse net magnetization, i.e., while the net magnetization vector comprises a non-vanishing transverse component. Thus, effects on spin displacement-induced phases accumulated by the spin manipulating gradients due to differences between the states of vibration may be reduced and/or avoided.

A vibration-matching gradient, in particular a strong gradient as required for diffusion-weighted MR, may be applied for equaling states of vibration of the subject and/or hardware components influencing the quality of the acquired magnetic resonance data. The aforementioned vibrations may comprise mechanical vibrations of one or more hardware components of the magnetic resonance system as well as of the subject to be analyzed. Vibrations of the subject as well as vibrations of hardware components of MR systems, may lead to signal losses, measurement errors and artefacts. In particular, when using strong gradients, like in case of diffusion gradients, vibrations may occur. Diffusion gradients may, depending on the pulse sequence used, yield vibrations, e.g., in a range of 20 Hz to 30 Hz with amplitudes up to 100 μm. Embodiments may have the beneficial effect of mitigating vibration artefacts using a vibration matching gradient generated chronologically before a pulse sequence comprising a pair of spin manipulating gradients.

A subject may, e.g., be a human person or part of a human person, like a limb, located in the data acquisition volume. Furthermore, a subject may be any type of body located within the data acquisition volume, such as, e.g., a sample container with a sample.

According to embodiments, the second state of vibration results from second vibrations induced by the first one of the at least two spin manipulating gradients. Thus, using a vibration matching gradient similar to the first spin manipulating gradient first vibrations similar to the second vibrations may be induced resulting in a first state of vibration matching the second state of vibration.

According to embodiments, the magnetic resonance protocol may be a magnetic resonance imaging protocol configured for acquiring magnetic resonance imaging data. Embodiments may have the beneficial effect of mitigating vibration artefacts in magnetic resonance images using a matching of states of vibration. MRI provides a medical imaging technique enabling a generation of images or parameter maps of anatomy and/or physiological processes of a body of subject, e.g., a human person.

According to embodiments, the magnetic resonance protocol may be a magnetic resonance spectroscopy protocol configured for acquiring magnetic resonance spectroscopy data. Embodiments may have the beneficial effect of mitigating vibration artefacts in magnetic resonance spectra using a matching of states of vibration. MRS, also known as nuclear magnetic resonance (NMR) spectroscopy, provides a non-invasive, ionizing-radiation-free analytical technique, which may, e.g., be used to studying metabolic changes. MRS may be used to determine relative concentrations and/or physical properties of a variety of biochemicals frequently referred to as "metabolites" due to their role in metabolism. Like MRI, MRS may acquire signals, i.e., magnetic resonance data, from hydrogen protons, but also other endogenous nuclei may be used, e.g., phosphorus, carbon, nitrogen, sodium or fluorine. MRS may thus enable obtaining chemical information, e.g., biochemical information about the tissues of the human body, whereas MM rather provides structural information such as information about the structure of a human body, e.g., a distribution of water and fat.

According to embodiments, the magnetic resonance protocol is sensitive to an accumulation of spin displacement-induced phases with the at least two spin manipulating gradients being used for accumulating spin displacement-induced phases and the acquired magnetic resonance data encoding effects of the accumulated spin displacement-induced phases.

Any contribution to the spin displacements due to differences between the states of vibration during which the motion spin manipulating gradients are generated may contaminate the accumulating spin displacement-induced phases. Using a vibration matching gradient, such differences may be efficiently avoided.

Using a vibration matching gradient as described above may for example be beneficial for mitigating signal losses, measurement errors and/or artefacts in case of a diffusion-weighted (DW) protocol with spin manipulating gradients in form of diffusion gradients.

DW allows for a mapping of diffusion processes of molecules, like water, in biological tissues, in vivo and non-invasively. Such molecular diffusion in tissue generally depends on interactions with obstacles, such as macromolecules, fibers, and membranes. Molecule diffusion patterns may therefore reveal microscopic details about tissue architecture. DW comprises a subsequent application of strong spin manipulating gradients in form of diffusion gradients. Diffusing spins may change position between the application of the diffusion gradients, causing the diffusing spins to fall out of phase and resulting in a measurable signal attenuation.

Any motion during the diffusion sensitizing periods of a diffusing-weighted magnetic resonance data acquisition may induce an additional accumulated phase and may eventually lead to signal cancellations due to intravoxel dephasing. The amount of the intravoxel dephasing by motion scales at a first approximation with the first diffusion gradient momentum. The stronger the diffusion weighting is, the stronger dephasing effects in the presence of vibrations may be. Embodiments may have the beneficial effect of reducing these dephasing effects due to vibrations. Thus, artefacts due to different states of vibration excited by strong gradients like diffusion gradients may be avoided.

Vibration induced artefacts may occur frequently depending on sequence parameters and specific setups used for the diffusion weighted magnetic resonance. To reduce the effect of vibrations, acquisition parameters may be changed. However, such changes may negatively influence the SNR efficiency of data acquisition. Furthermore, changes of the design of hardware components, like, e.g., gradient system or table, have been considered to reduce the influence of vibrations. However, even for a state-of-the-art MR system, vibrations are still an issue. The present disclosure suggests to mitigate artefacts by placing a vibration matching gradient before, e.g., a diffusion preparation according to a diffusion-weighted magnetic resonance protocol. By appropriately selecting the temporal position of the vibration matching gradient, similar vibrations are induced by the vibration matching gradient as they are induced by the diffusion gradients such that the similar states of vibration are generated each time diffusion are applied.

Widths of diffusion gradients may be considerably longer than widths of most imaging gradients. The extent of diffusion-weighting increases with the b-value. The b-value reflects the strength and timing of the gradients used to generate diffusion-weighted images. The higher the b-value, the stronger the diffusion effects. For achieving a large b-value the diffusion-weighting gradients may, e.g., be several tens of milliseconds in length, which inevitably leads to a rather long TE. However, a long TE may reduce the SNR. In order to minimize TE, a maximum gradient amplitude available on an MR system may be employed for DW MR. However, generating gradients with rather larger amplitude may induce non negligible vibrations in hardware components of the MR system as well as in a subject from which MR data is to be acquired.

However, beneficial applications of such a vibration matching gradient are not limited to diffusion-weighted magnetic resonance. According to embodiments, the magnetic resonance protocol may be one of the following: a diffusion-weighted protocol, an apparent diffusion coefficient protocol, a diffusion tensor imaging protocol, a diffusion-weighted spectroscopy protocol, a diffusion weighted preparation protocol, a higher-order diffusion model protocol, a phase contrast velocimetry protocol, a displacement encoding protocol and a magnetic resonance elastography protocol.

According to embodiments, the execution of the machine executable instructions further causes the processor to control the magnetic resonance system to compute a representation of the acquired magnetic resonance data. The representation may comprise a graphical representation, such as an image, a map, a spectrum or a graph. Furthermore, the representation may comprise a parameter of interest, like, e.g., a scaler, vector or matrix. The parameter may, e.g., be a modeled parameter resulting as an output from a computational model to which the acquired magnetic resonance is provided as an input.

According to embodiments, the computing of the representation comprises computing one or more of the following using the acquired magnetic resonance data: a diffusion-weighted magnetic resonance image, an apparent diffusion coefficient map, a diffusion tensor image, an exponential apparent diffusion coefficient map, a fractional anisotropy image, a principal diffusion direction map, a fiber tracking map, a velocity map, a magnetic resonance spectrum, an elastogram and a modeled parameter extracted using a signal model in-cooperating diffusion-weighting, velocity encoding and/or displacement encoding.

For example, a vibration compensation as suggested herein may be used for an in vivo fiber tracking. The fiber tracking may comprise one or more fiber tracking maps being computed. For example, seeds in the posterior part of a human brain may be used for calculating fiber tracks. Resulting fiber tracks may, e.g., be used clinically for surgery planning. Fiber tracks calculated based on raw data acquired with the proposed vibration matching gradient may reveal more structure within the human brain than fiber tracks calculated based on raw data acquired without the proposed vibration matching gradient. Fiber tracks determined using the proposed vibration matching gradient may, e.g., be longer.

According to embodiments, the one or more hardware elements comprise a supporting element for supporting the subject in the data acquisition volume of the magnetic resonance system. Embodiments may have the beneficial effect of allowing for an efficient and effective compensation of differences in states of vibration of the subject due to vibrations excited in a supporting element for supporting the subject. Vibrations of a supporting element, like a supporting table, may directly be transferred to the subject supported.

According to embodiments, a first time interval between generating the vibration matching gradient and the first one of the at least two spin manipulating gradients equals a second time interval between generating the first one and the second one of the at least two spin manipulating gradients. Embodiments may have the beneficial effect of enabling an efficient and effective matching of a first state of vibration depending on the vibration matching gradient, during which the first spin manipulating gradient is generated, and a second state of vibration depending on the first spin manipulating gradient, during which the second spin manipulating gradient is generated. It has been found that the matching may be most effective, when the first and second time intervals, during which a damping of the first and second vibrations occurs, are equal.

According to embodiments, an amplitude of the vibration matching gradient equals an amplitude of the first one of the at least two spin manipulating gradients. Embodiments may have the beneficial effect of enabling an efficient and effective matching of the first and second state of vibration, when the amplitudes of the gradients inducing the first and second vibrations causing the first and second vibration state are equal. According to embodiments, the amplitude of the vibration matching gradient equals the amplitudes of both spin manipulating gradients.

According to embodiments, the vibration matching gradient comprises a first waveform and first one of the at least two spin manipulating gradients comprises a second waveform, wherein a slope of a flank of the first waveform equals a slope of a flank of the second waveform. Embodiments may have the beneficial effect of enabling an efficient and effective matching of the first and second state of vibration, when slopes of flanks of the gradients exciting the first and second vibrations causing the first and second vibration state are equal. Equal slopes of flanks causing equal rates of change of the magnetic fields may result in equal vibrations being induced. According to embodiments, the slopes of all flanks of the of the first waveform equal a slope of a flank of the second waveform. The second one of the at least two spin manipulating gradients may comprise a third waveform. According to embodiments, the slope of the flank of the first waveform may equal a slope of a flank of the second as well as the third waveform. According to embodiments, the slopes of all flanks of the first waveform equal slopes of the flanks of the second and third waveform.

According to embodiments, the waveforms may be rectangular, trapezoid, sinusoidal or more complex waveforms. The waveforms may, e.g., result from a combination and/or superposition of a plurality of individual waveforms. The individual waveforms may be waveforms of gradients with different polarities, e.g. in case of acceleration compensation.

According to embodiments, the first waveform equals the second waveform. Embodiments may have the beneficial effect of enabling an efficient and effective matching of the first and second state of vibration, when waveforms of the gradients inducing the first and second vibrations causing the first and second vibration state are equal. According to embodiments, the first waveform equals the second and the third waveform.

In another aspect, the invention relates to a computer program product comprising machine executable instructions for execution by a processor controlling a magnetic resonance system configured for acquiring magnetic resonance data from a subject in a data acquisition volume of the magnetic resonance system. The computer program product further comprises a set of waveform and pulse sequence commands. The set of waveform and pulse sequence commands is configured for generating a vibration matching gradient for inducing first vibrations of one or more hardware elements of the magnetic resonance system and/or the subject. The vibration matching gradient is generated while a net magnetization vector of the subject is aligned along, i.e., parallel or antiparallel to, a longitudinal axis of a main magnetic field generated by the magnetic resonance system.

The set of waveform and pulse sequence commands is further configured for acquiring magnetic resonance data from the subject according to a magnetic resonance protocol. The acquiring of the magnetic resonance data comprises generating in sequence at least two spin manipulating gradients for manipulating phases of nuclear spins within the subject. The at least two spin manipulating gradients are each generated while the net magnetization vector of the subject comprises a non-vanishing component of net magnetization in a transverse plane perpendicular to the longitudinal axis of the main magnetic field.

Execution of the machine executable instructions causes the processor to control the magnetic resonance system using the set of waveform and pulse sequence commands to prepare a first state of vibration of the one or more hardware elements and/or the subject. The preparing comprises generating the vibration matching gradient inducing the first vibrations of the one or more hardware elements and/or the subject, while the net magnetization vector of the subject is aligned along the longitudinal axis of the main magnetic field.

Furthermore, the magnetic resonance data is acquired according to the magnetic resonance protocol. The acquiring comprises generating in sequence the at least two spin manipulating gradients for manipulating phases of nuclear spins within the subject, while the net magnetization vector of the subject comprises a non-vanishing component in the transverse plane perpendicular to the longitudinal axis of the main magnetic field. A first one of the at least two spin manipulating gradients is generated during the first state of vibration and a second one of the at least two spin manipulating gradients is generated during a second state of vibration of the one or more hardware elements and/or the subject. The vibration matching gradient is used for matching with the first state of vibration the second state of vibration.

According to embodiments, the computer program product further comprises machine executable instructions configured to implement any of the embodiments of methods described herein to be executed by the magnetic resonance system.

In another aspect, the invention relates to a method for operating a magnetic resonance system configured for acquiring magnetic resonance data from a subject in a data acquisition volume of the magnetic resonance system. The magnetic resonance system comprises a memory storing machine executable instructions and a set of waveform and pulse sequence commands. The set of waveform and pulse sequence commands is configured for generating a vibration matching gradient for inducing first vibrations of one or more hardware elements of the magnetic resonance system and/or the subject. The vibration matching gradient is generated while a net magnetization vector of the subject is aligned along, i.e., parallel or antiparallel to, a longitudinal axis of a main magnetic field generated by the magnetic resonance system.

The set of waveform and pulse sequence commands is further configured for acquiring magnetic resonance data from the subject according to a magnetic resonance protocol. The acquiring of the magnetic resonance data comprises generating in sequence at least two spin manipulating gradients for manipulating phases of nuclear spins within the subject. The at least two spin manipulating gradients are each generated while the net magnetization vector of the subject comprises a non-vanishing component of net magnetization in a transverse plane perpendicular to the longitudinal axis of the main magnetic field.

The magnetic resonance system further comprises a processor for controlling the magnetic resonance system. Execution of the machine executable instructions causes the processor to control the magnetic resonance system according to the method using the set of waveform and pulse sequence commands. The method comprises preparing a first state of vibration of the one or more hardware elements and/or the subject. The preparing comprises generating the vibration matching gradient inducing the first vibrations of the one or more hardware elements and/or the subject, while the net magnetization vector of the subject is aligned along the longitudinal axis of the main magnetic field.

Furthermore, the method comprises acquiring the magnetic resonance data according to the magnetic resonance protocol. The acquiring comprises generating in sequence the at least two spin manipulating gradients for manipulating phases of nuclear spins within the subject, while the net magnetization vector of the subject comprises a non-vanishing component in the transverse plane perpendicular to the longitudinal axis of the main magnetic field. A first one of the at least two spin manipulating gradients is generated during the first state of vibration and a second one of the at least two spin manipulating gradients is generated during a second state of vibration of the one or more hardware elements and/or the subject. The vibration matching gradient is used for matching with the first state of vibration the second state of vibration.

According to embodiments, the method may comprise any of the embodiments of methods described herein to be executed by the magnetic resonance system.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments, computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products According to embodiments, of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by nuclear spins using the antenna of a magnetic resonance system during a magnetic resonance scan. A Magnetic Resonance Imaging (MM) image or MR image is defined herein as being the reconstructed two or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
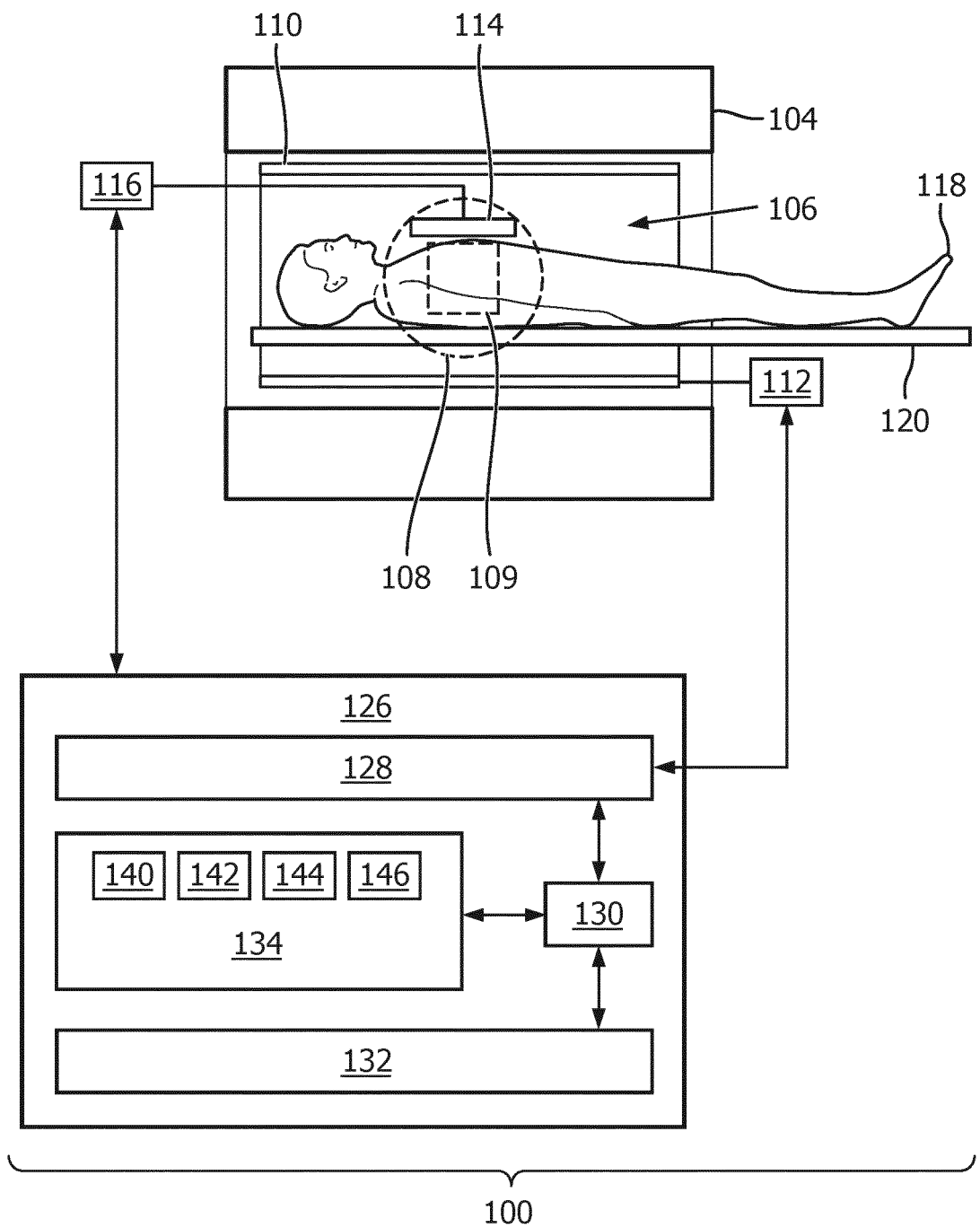
FIG. 1 illustrates an example of a magnetic resonance system.

FIG. 1 illustrates an example of a magnetic resonance system 100. The magnetic resonance system 100 comprises a magnet 104. The magnet 104 is a superconducting cylindrical type magnet with a bore 106 through it. The use of different types of magnets is also possible. For instance, it is also possible to use both a split cylindrical magnet and a so-called open magnet. A split cylindrical magnet is similar to a standard cylindrical magnet, except that the cryostat has been split into two sections to allow access to the iso-plane of the magnet. Such magnets may for instance be used in conjunction with charged particle beam therapy. An open magnet has two magnet sections, one above the other with a space in-between that is large enough to receive a subject 118 to be imaged, the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is a data acquisition volume 108, also referred to as an imaging zone, where the magnetic field is strong and uniform enough to perform magnetic resonance imaging. A region of interest 109 is shown within the imaging zone 108. The magnetic resonance data is typically acquired for the region of interest. A subject 118 is shown as being supported by a subject support element 120 such that at least a portion of the subject 118 is within the imaging zone 108 and the region of interest 109. In this example, the support element 120 is a support table. In other examples, other designs and/or combinations of support elements may be used for supporting and positioning the subject 118 within the imaging zone 108 and the region of interest 109.

Within the bore 106 of the magnet there is also a set of magnetic field gradient coils 110 which is used for generating magnetic field gradients, e.g. pulsed magnetic field gradients. The set of magnetic field gradient coils 110 is, e.g., used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically, magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise, the transceiver 116 may also represent a separate transmitter and separate receivers. The radio-frequency coil 114 may also have multiple receive/transmit elements and the radio frequency transceiver 116 may have multiple receive/transmit channels. For example, if a parallel imaging technique such as SENSE is performed, the radio-frequency coil 114 will have multiple coil elements.

In this example the subject 118 is positioned such that the subject's thorax region is located within the region of interest 109. In other examples, other parts of the subject's 118 body may be positioned in the region of interest 109. In other examples, the subject 118 may be some other object, like, e.g., a sample container comprising a sample 119 as shown in FIG. 2.

The transceiver 116 and the gradient controller 112 are shown as being connected to a hardware interface 128 of a computer system 126. The computer system further comprises a processor 130 that is in communication with the hardware interface 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 134 may be considered to be a non-transitory computer-readable medium. The user interface 132 may enable the processor 104 to display or render images and other information which may be provided to a user or operator. The user interface 132 may also be used to receive control or input data from a user or operator. The user interface 132 may comprise a display for selecting and/or configuring pulse sequences as well as displaying results of magnetic resonance data acquisition and/or processing executed by the magnetic resonance system 100.

The memory 134 is shown as containing machine-executable instructions 140. The machine-executable instructions 140 enable the processor 130 to control the operation and function of the magnetic resonance system 100 to execute a magnetic resonance imaging procedure. The machine-executable instructions 140 may also enable the processor 130 to perform various data analysis and calculation functions, e.g., data processing and image processing tasks. The memory 134 is further shown as containing a set of waveform and pulse sequence commands 142. The waveform and pulse sequence commands 142 are either instructions or data which can be converted into instructions which enable the processor 104 to control the magnetic resonance system 100 to acquire magnetic resonance imaging data 144. The set of waveform and pulse sequence commands 142 may be configured for generating a vibration matching gradient for inducing first vibrations of one or more hardware elements of the magnetic resonance system 100 and/or the subject 118. The vibration matching gradient while a net magnetization vector of the subject 118 is aligned along, i.e., parallel or antiparallel to, a longitudinal axis of the main magnetic field generated by the magnetic resonance system 100. The set of waveform and pulse sequence commands 142 may further be configured for acquiring magnetic resonance data from the subject according to a magnetic resonance protocol. The acquiring of magnetic resonance data 144 comprises generating in sequence at least two spin manipulating gradients for manipulating phases of nuclear spins within the subject 118 in the imaging volume 108 according to a magnetic resonance imaging protocol. The least two spin manipulating gradients are generated while the net magnetization vector of the subject comprises a non-vanishing component of net magnetization in a transverse plane perpendicular to the longitudinal axis of the main magnetic field. The magnetic resonance imaging protocol may be any of the magnetic resonance imaging protocol described herein. The magnetic resonance imaging protocol may, e.g., be sensitive to an accumulation of spin displacement-induced phases. The at least two spin manipulating gradients may be used for accumulating spin displacement-induced phases and the acquired magnetic resonance data may comprise effects of the accumulated spin displacement-induced phases encoded therein. The memory 134 is further shown as containing the magnetic resonance imaging data 144 acquired by controlling the magnetic resonance system 100 with the waveform and pulse sequence commands 142. Furthermore, the memory 110 may comprise one or more representations 146 of the acquired magnetic resonance data 144, e.g., graphical representations in form of magnetic resonance images reconstructed using the acquired magnetic resonance imaging data 144. The one or more representations 146 may comprise any representation described herein.

Figure 2:
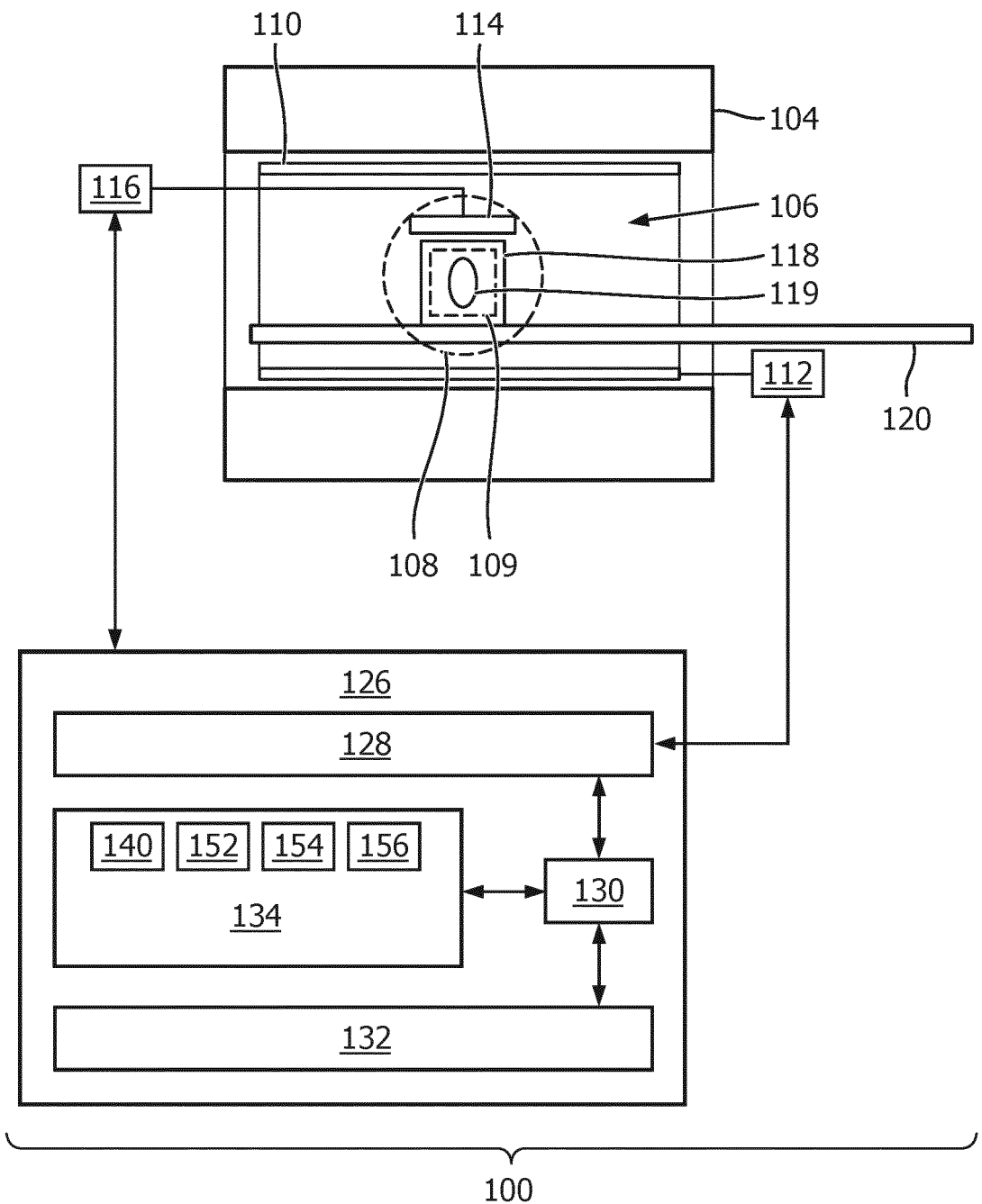
FIG. 2 illustrates an example of a magnetic resonance system.

FIG. 2 shows a further exemplary embodiment of the magnetic resonance system 100 of FIG. 1. In the data acquisition volume 108 a subject 118 in form of sample container providing a sample 119 is located. Alternatively, the subject 118 may be some other object or a human person, like shown in FIG. 1, at least a portion of which is located within the data acquisition volume 108 and the region of interest 109. The machine-executable instructions 140 stored in memory 134 may enable the processor 130 to control the operation and function of the magnetic resonance system 100 to perform magnetic resonance imaging/spectroscopy using waveform and pulse sequence commands 152. The waveform and pulse sequence commands 152 are either instructions or data which can be converted into instructions enabling the processor 104 to control the magnetic resonance system 100 to acquire magnetic resonance imaging/spectroscopy data 154. The set of waveform and pulse sequence commands 152 may be configured for generating a vibration matching gradient for inducing first vibrations, while the net magnetization is oriented longitudinal without any transverse net magnetization present. The set of waveform and pulse sequence commands 152 may further be configured for acquiring of the magnetic resonance imaging/spectroscopy data 154 from the subject 118 in the data acquisition volume 108 according to a magnetic resonance imaging/spectroscopy protocol. The magnetic resonance imaging/spectroscopy protocol may be any magnetic resonance imaging/spectroscopy protocol described herein, according to which the data acquisition comprises generating in sequence at least two spin manipulating gradients for manipulating phases of nuclear spins within the subject 118 in the data acquisition volume 108, while at least some transverse net magnetization is present. The memory 110 is further shown as containing magnetic resonance imaging/spectroscopy data 154, that has been acquired by controlling the magnetic resonance system 100 with the waveform and pulse sequence commands 152. Furthermore, the memory 110 may comprise one or more representations 156 of the acquired magnetic resonance data 154, like a magnetic resonance spectrum, a magnetic resonance image or some parameters computed using the acquired magnetic resonance imaging/spectroscopy data 154.

Figure 3:
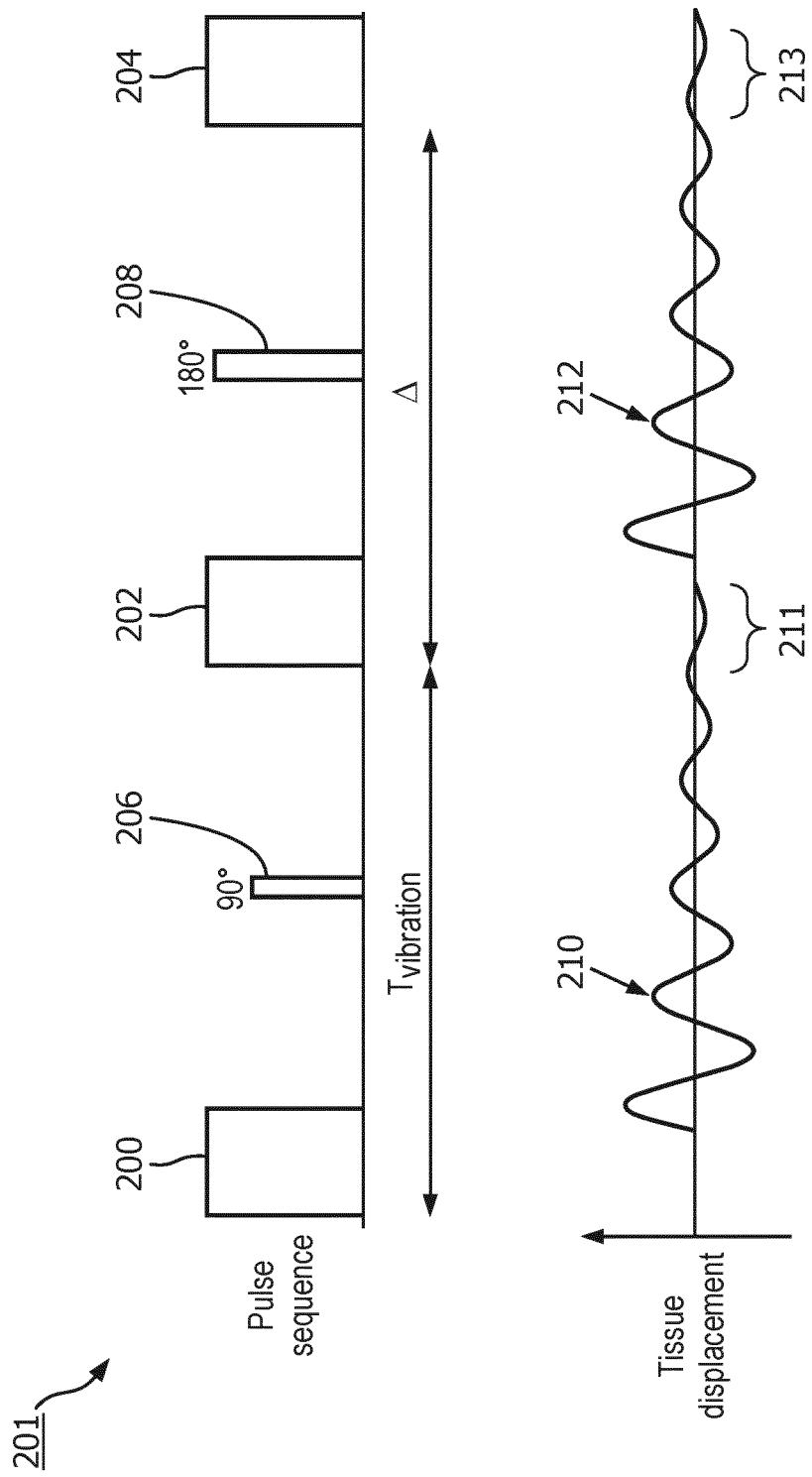
FIG. 3 illustrates an exemplary pulse sequence.

FIG. 3 illustrates an exemplary pulse sequence 201 generated according to a set of waveform and pulse sequence commands. The pulse sequence 201 is supplemented by a vibration matching gradient 200 generated, while the net magnetization vector of the subject is aligned longitudinal, i.e., before any RF-pulses have been applied or after their effect on the net magnetization has dissipated. The pulse sequence 201 further comprises a pair of spin manipulating gradients 202, 204 for manipulating phases of nuclear spins, generated while the net magnetization vector comprises a non-vanishing transverse component, i.e., a non-vanishing component in a transverse plane perpendicular to the longitudinal axis of the net magnetic field, due to the RF-pulses. The pulse sequence 201 may, e.g., be implemented in form of a vibration-compensated DW spin echo (diffusion-weighted spin echo) sequence, i.e., a DW spin echo sequence which has been extended by a vibration compensating gradient in form of a vibration matching gradient 200. The DW spin echo sequence 201 comprises a 90° RF-pulse and a 180° RF-pulse. Symmetrically distributed around the 180° RF-pulse are the two spin manipulating gradients 202, 204 in form of diffusion gradients temporally spaced apart from each other by a time interval Δ. The vibration matching gradient 200 may have the same waveform, i.e., shape, and amplitude as the diffusion gradients 202, 204. A time interval $T_{vibration}$ between the vibration matching gradient 200 and the first diffusion gradient 202 may be equal to Δ.

The gradients 200, 202, 204 of sequence 201 may each induce tissue displacements, i.e., vibrations of the subject. Without the vibration matching gradient 200, the first diffusion gradient 202 may be generated in a state of vibration of the subject with negligible vibrations. The first diffusion gradient 202, however, may induce mechanical vibrations in hardware components of the MR system as well as in the subject resulting in the tissue displacements 212. Tissue displacements 212 may be damped with time, i.e., during time interval Δ, resulting in a state of vibration 213 during which the second diffusion gradient 202 is generated that differs significantly from the state of vibration during which the first diffusion gradient 202 was generated. Any magnetic resonance protocol that is sensitive to an accumulation of spin displacement-induced phases will be negatively affected by such differences between states of vibrations. When the vibration matching gradient 200 is added, the vibration matching gradient 200 induces additional vibrations resulting in tissue displacements 210 that are damped with time, i.e., during time interval $T_{vibration}$. The damped tissue displacements 210 result in a state of vibration 211 during which the first diffusion gradient 202 is generated that matches the subsequent state of vibration 213. In other words, the displacements 210, 212 are similar for both diffusion gradients 202, 204. Thus, negative influences on the accumulation of spin displacement-induced phases due to differences between the states of vibration 211, 213 may be efficiently prevented.

Figure 4:
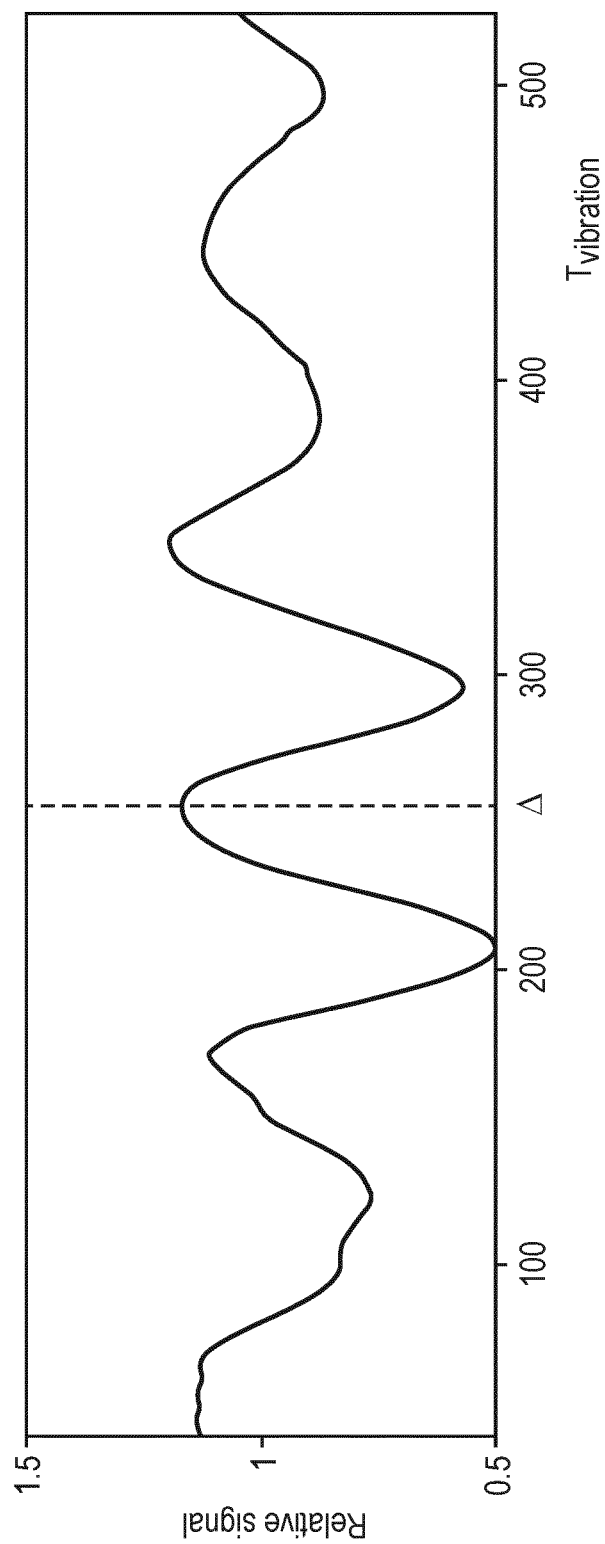
FIG. 4 illustrates an exemplary dependency of the vibration compensation on $T_{vibration}$.

FIG. 4 illustrates an exemplary dependency of the vibration compensation on the time interval $T_{vibration}$ between a vibration matching gradient and a first spin manipulating gradient. For the analysis shown in FIG. 4, a high b-value DW TSE sequence has been used for measuring lipids ADC in a water-fat-phantom. The high b-value DW TSE sequence comprises of a DW stimulated echo preparation with four 90° RF pulses and mono-polar diffusion sensitizing gradients, followed by a 2D-TSE readout. A vibration matching gradient matching the diffusion sensitizing gradients is generated before the diffusion preparation.

The water-fat-phantom is an 80% fat fraction water-fat-phantom. The water-fat-phantom comprises 800 ml oil, 200 ml water, 4 ml Tween80 and 1 g of sodium benzoate. Emulsification is carried out with a colloid mill at 6000 revolutions per minute. The phantom is scanned with a 3T-MR-system using an 8-channel wrist coil on a supporting table of the MR-system.

The time interval $T_{vibration}$ is varied under strong diffusion weighting with a b-value of 50,000 s/mm$^2$ within a range from 40 ms to 525 ms in order to determine an optimal $T_{vibration}$. Further parameters used comprise a field of view (FOV) of (120 mm)$^2$, a voxel size of 2×2×10 mm$^3$, a repetition time (TR) of 2000 ms, an echo time (TE) of 23 ms, a $TM_{Prep}$ of 220 ms and a $TE_{Prep}$ of 61 ms.

FIG. 4 depicts a mean signal evolution in DWI raw images of the water-fat-phantom for different length of the time interval $T_{vibration}$. The signal depicted is a relative signal, i.e., the signal with vibration compensation over the signal without vibration compensation. A single global maximum of the relative signal amplitude of 117% of the signal value without vibration compensation can be observed for the time interval $T_{vibration}$ equaling the time interval Δ between the first and a second sensitizing gradient, also referred to as diffusion time. Further local maxima are shown with relative signal amplitude of more than 100%, but less than 117%. These local maxima resemble the eigenfrequencies of the subject being analyzed. Thus, alternative to $T_{vibration}=\Delta$, the time interval $T_{vibration}$ of one of the local maxima may be determined and used for a vibration compensation. However, the most efficient and thus preferable choice may be $T_{vibration}=\Delta$.

FIG. 5 illustrate exemplary dependencies of the vibration compensation on b-value. As in FIG. 4, a high b-value DW TSE sequence is used for measuring lipids ADC in the water-fat-phantom. The ADC is measured with a b-value in a range from 5,000 s/mm$^2$ to 50,000 s/mm$^2$ using steps of 5,000 s/mm$^2$ without and with using a vibration matching gradient. Further parameters used comprise a field of view (FOV) of (120 mm)$^2$, a voxel size of 2×2×10 mm$^3$, a TR of 2000 ms, a TE of 23 ms, a $TM_{Prep}$ of 220 ms and a $TE_{Prep}$ of 61 ms. The frequency of the observed signal oscillation is of the order of 11 Hz.

Figure 5A:
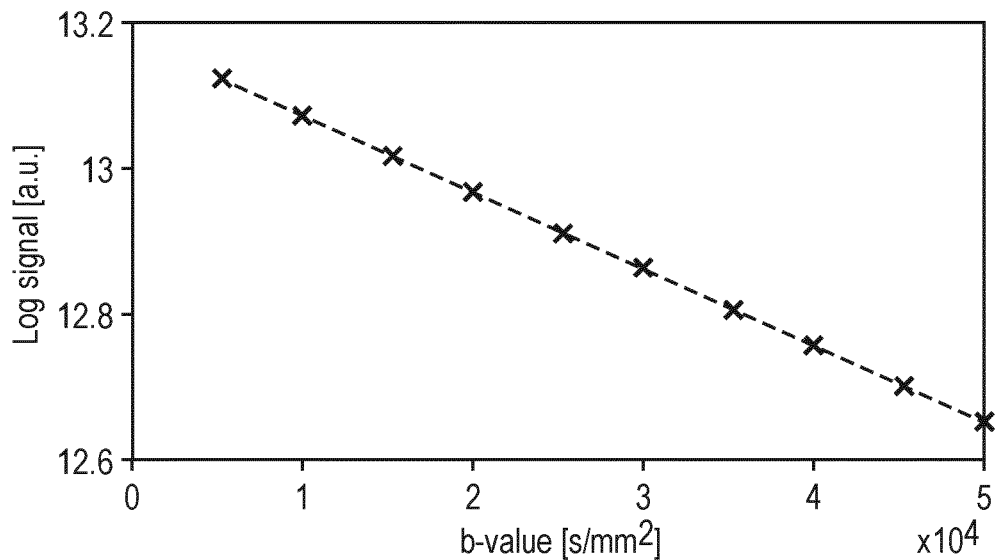
FIG. 5 illustrate exemplary dependencies of the vibration compensation on b-value.
Figure 5B:
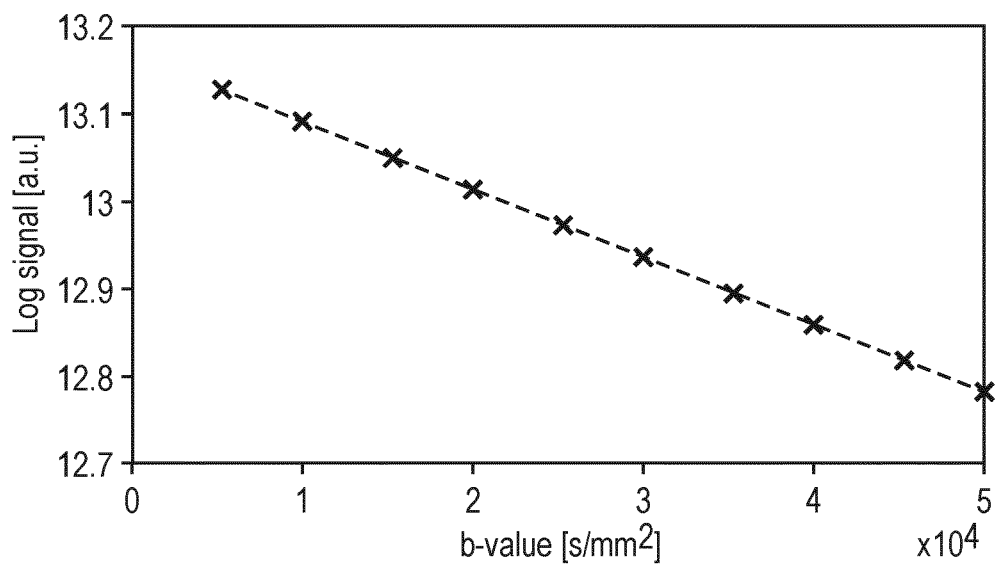
Figure 5C:
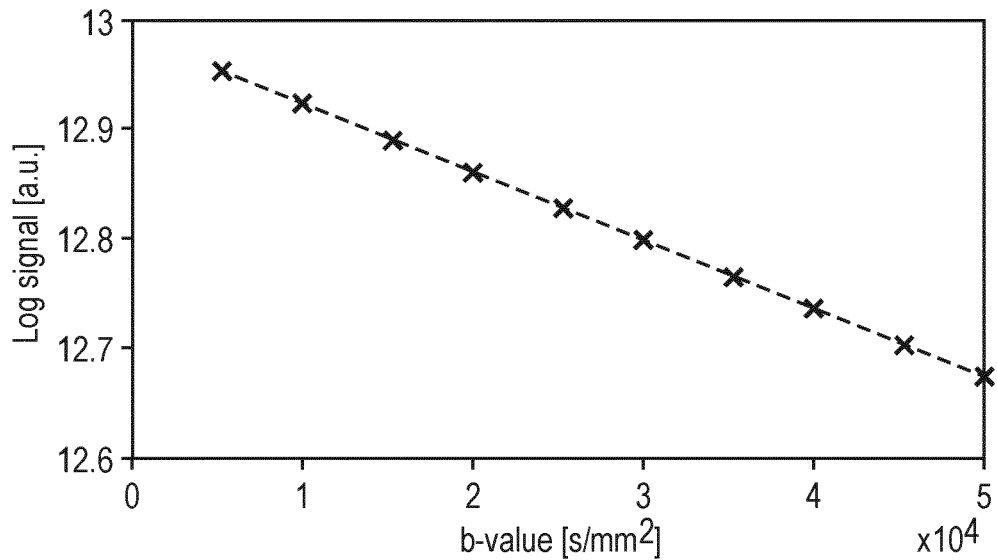
Figure 5D:
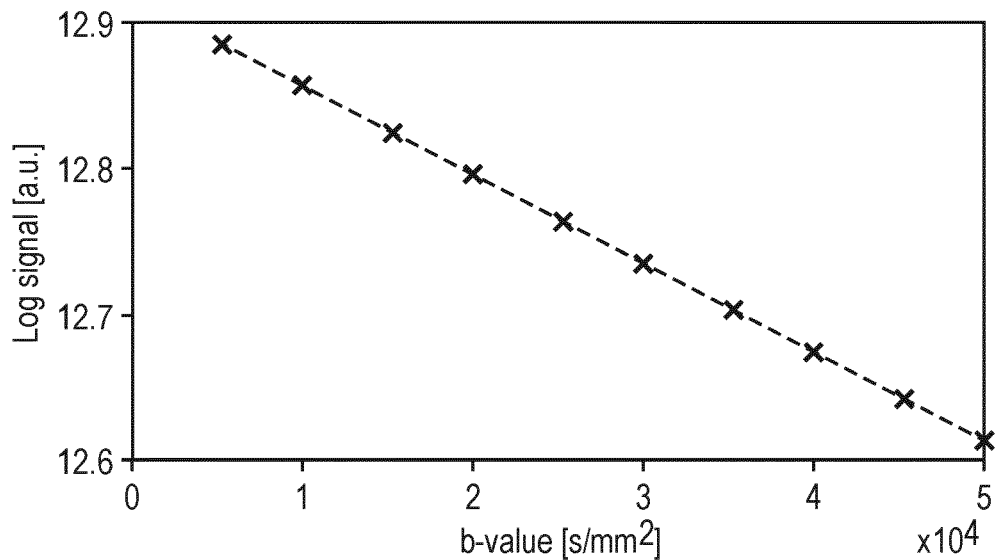

In FIG. 5A, a log of a measured signal decay curve and a mean ADC value without using the vibration matching gradient are shown. The fit of the ADC value yields 1.1 e$^{-0.5}$ mm$^2$/s. In FIG. 5B, a log of a measured signal decay curve and mean ADC value using the vibration matching gradient are shown. In this case, the fit of the ADC value yields 7.8 e$^{-0.6}$ mm$^2$/s. For the measurements shown in FIG. 5C and FIG. 5D, a standard scanner table comprised by the MR system and used for the measurements of FIGS. 5A and 5B has been replaced by a wooden support structure. This wooden support structure decouples the subject located thereon from vibrations introduced by the MR system, e.g., introduced due to gradients generated by the MR system. In FIG. 5C, a log of a measured signal decay curve and a mean ADC value for the wooden support structure without using the vibration matching gradient are shown. The fit of the ADC value yields 6.2 $e^{-0.6}$ mm²/s. In FIG. 5B, a log of a measured signal decay curve and mean ADC value for the wooden support structure using the vibration matching gradient are shown. In this case, the fit of the ADC value yields 6.1 $e^{-0.6}$ mm²/s. Thus, the ADC value is 70% higher when comparing the measurements performed on the standard scanner table in FIG. 5A with the wooden support structure in FIG. 5C, each without any vibration compensation using a vibration matching gradient. When the vibration matching gradient is employed a 25% higher ADC value is measured in FIG. 5B compared with FIG. 5D. Only minor differences of about 2% are observable for using the wooden support structure without and with vibration-compensation gradient in FIGS. 5C and 5D. This illustrates the effectiveness of vibration compensation using the method proposed herein. The ADC value determined using the standard scanner table with the proposed vibration compensation method matches the ADC values determined using the wooden support structure, i.e., the ADC values determined for a subject decoupled from vibrations introduced by the MR system, significantly better than the ADC value determined using the standard scanner table without the proposed vibration compensation method.

Figure 6:
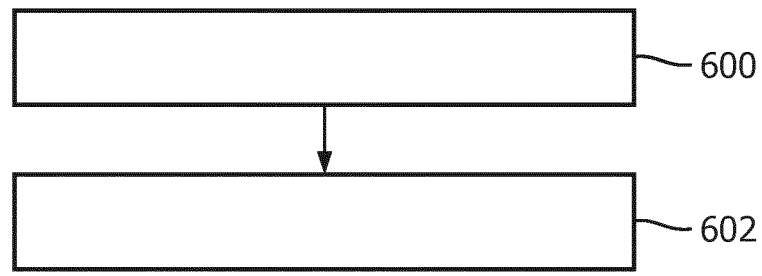
FIG. 6 shows a flow chart which illustrates a method of operating the magnetic resonance system of FIG. 1 and FIG. 2.

FIG. 6 shows a flow chart which illustrates a method of operating the MR systems of FIG. 1 and FIG. 2. In step 600, a first state of vibration of the one or more hardware elements of the MR system and/or the subject in the data acquisition volume of the MR system is prepared. For this purpose, a vibration matching gradient is generated. The vibration matching gradient is generated, while a net magnetization vector of the subject is aligned parallel or antiparallel to a longitudinal axis of a main magnetic field generated by the magnetic resonance system. The generation of the vibration matching gradient induces first vibrations of one or more hardware elements and/or the subject resulting in the first state of vibration. In step 602, magnetic resonance data is acquired from the subject according to a magnetic resonance protocol, e.g., a magnetic resonance protocol sensitive to an accumulation of spin displacement-induced phases. According to the magnetic resonance protocol at least two spin manipulating gradients for manipulating phases of nuclear spins within the subject are generated in sequence, while the net magnetization vector of the subject comprises a non-vanishing component of net magnetization in the transverse plane perpendicular to the longitudinal axis of the main magnetic field. The first spin manipulating gradient is generated during the first state of vibration prepared using the vibration matching gradient. Since the first spin manipulating gradient itself as well induces vibrations, i.e., second vibrations, of the one or more hardware elements and/or the subject, a second state of vibration results from the second vibrations, during which the second spin manipulating gradient is generated. The vibration matching gradient of step 600 is configured for mimicking with the first state of vibration the second state of vibration resulting in a matching of both states. In addition, one or more representations of the acquired magnetic resonance data may be computed. The computed representation may comprise a graphical representation, such as an image, a map, a spectrum, or a graph, and/or the computed representation may comprise a parameter of interest, like, e.g., a scaler, vector or matrix.

Figures 7A, 7B, 7C:
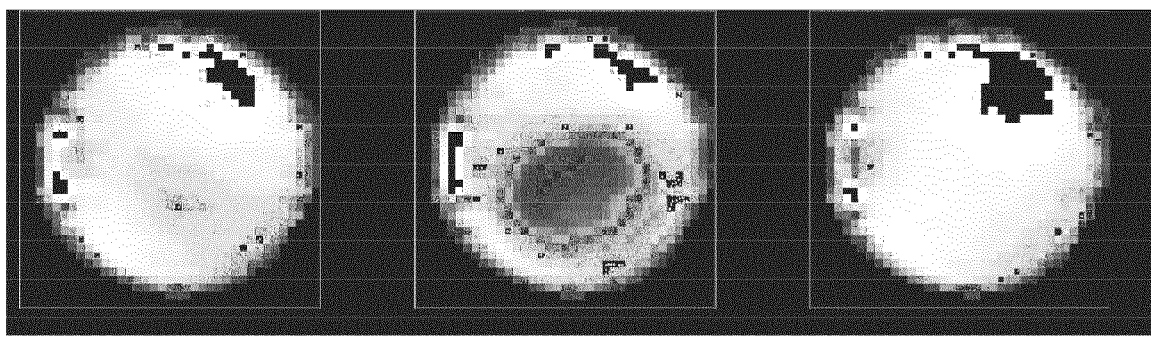
FIG. 7 illustrate exemplary dependencies of the vibration compensation on $T_{vibration}$.
Figure 8A:
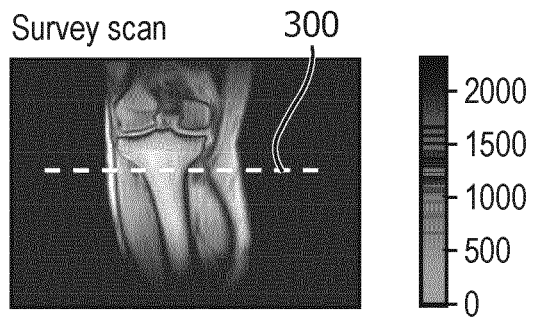
FIG. 8 illustrate an exemplary vibration compensation.
Figure 8B:
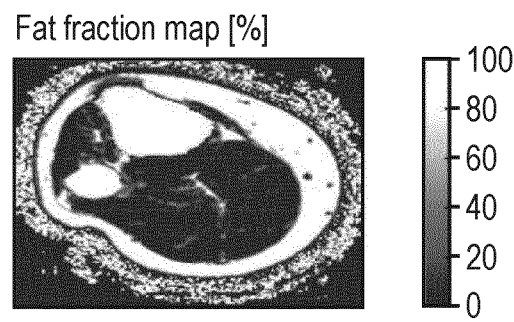
Figure 8C:
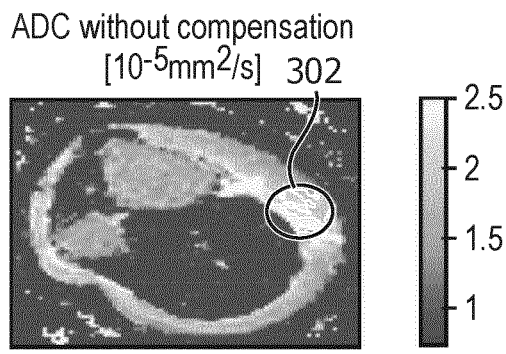
Figure 8D:
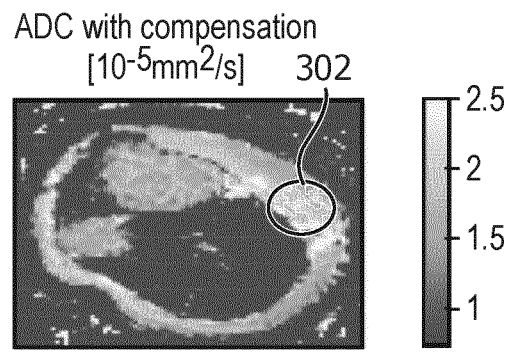
Figure 8E:
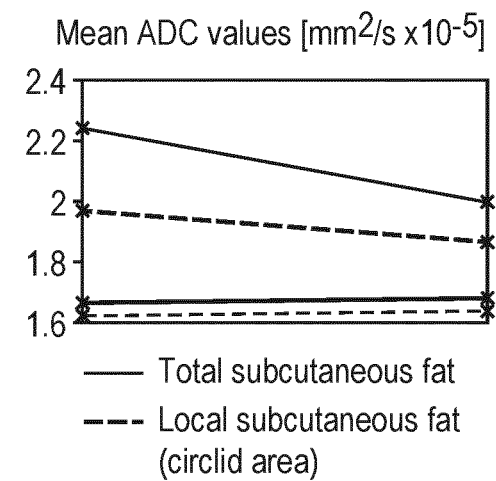
Figure 8F:
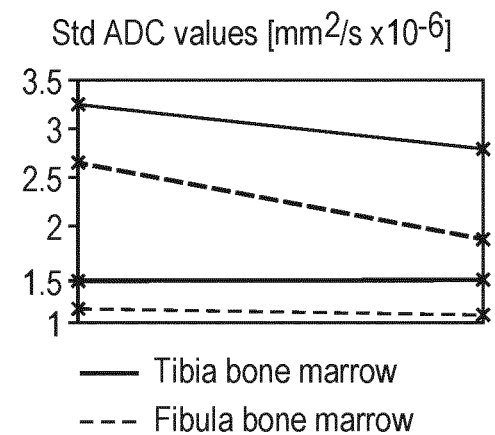

FIG. 7 illustrate exemplary dependencies of the vibration compensation on $T_{vibration}$ for the setup of FIG. 4. In FIG. 7A, a DW image of the fat-water-phantom is shown using a high b-value DW TSE sequence without applying a vibration matching gradient. FIG. 7B shows a DW image of the fat-water-phantom using a high b-value DW TSE sequence with a vibration matching gradient. The time interval $T_{vibration}$ is chosen to be $T_{vibration}$=205 ms. $T_{vibration}$=205 ms corresponds to a global minimum of the relative signal amplitude depicted in FIG. 4, where the signal with vibration compensation is about on half of the signal without vibration compensation. FIG. 7C as well shows a DWI image of the fat-water-phantom using a high b-value DW TSE sequence with a vibration matching gradient. In FIG. 7C, the time interval $T_{vibration}$ is chosen to be $T_{vibration}$=255 ms. $T_{vibration}$=255 ms corresponds to Δ, i.e., the global maximum of the relative signal amplitude of 117% depicted in FIG. 4.

FIG. 8 illustrate an exemplary vibration compensation in case of an analysis of lipids ADCs in vivo in a human leg. FIG. 8A shows the location of a 2D imaging slice 300 through a lower leg. FIG. 8B shows a corresponding fat fraction map acquired at this location. FIGS. 8C and 8D show ADC maps obtained without applying a vibration matching gradient (FIG. 8C) and with applying a vibration matching gradient (FIG. 8D). The measurements are performed using an 8-channel extremity coil with the following parameters: FOV of (140 mm)², voxel size of (2.2 mm)³, TR of 1800 ms, TE of 10 ms, $TM_{Prep}$ of 220 ms, and $TE_{Prep}$ of 61 ms. The b-values are identical with the water-fat-phantom experiment shown in FIG. 4, FIG. 5, and FIG. 7. The scan time is 4:32 min. A comparison of FIG. 8C with FIG. 8D illustrates that the subcutaneous fat ADC is qualitatively more heterogeneous, especially in the region indicated by the ellipse 302, without vibration matching gradient. A more homogenous ADC value in the subcutaneous fat is observed with the vibration matching gradient, especially in region 302 of FIG. 8D. In FIG. 8E, a mean ADC value and in FIG. 8F a corresponding standard deviation are shown for different segmented regions of the lower leg. On the left frame axis of FIG. 8E and FIG. 8F, values determined without vibration compensation are plotted, while on the right frame axis of FIG. 8E and FIG. 8F, values determined with vibration compensation are plotted. In the subcutaneous fat, a total decrease of 5% and a local decrease of 12% are observed in the ADC according to FIG. 8E. Furthermore, a decrease of 16% in total and 43% locally are observed in the ADC standard deviation with the vibration matching gradient according to FIG. 8F. In the tibia and fibula bone marrow, only minor differences are observed. In summary, in the subcutaneous fat, a global and local (cf region 302 in FIG. 8C and FIG. 8D) decrease in the ADC value and standard deviation are observed, whereas the values stay nearly constant for the more rigid region of the bone marrow in the tibia and fibula.

Figures 9A, 9B:
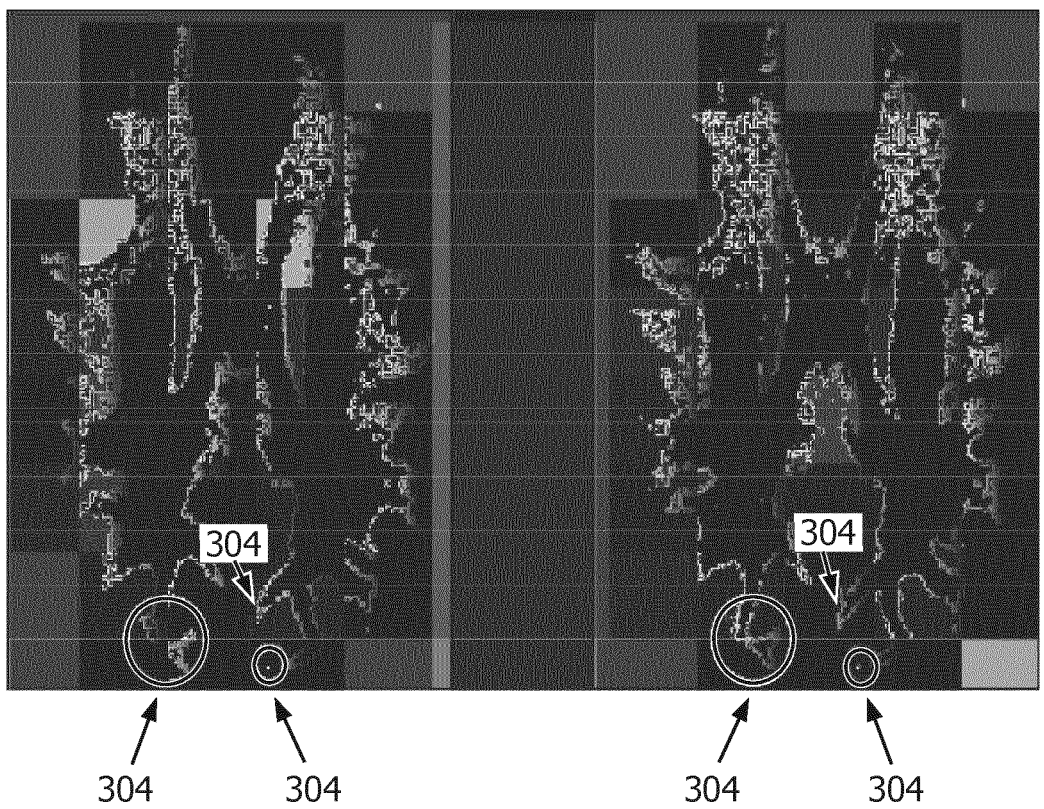
FIG. 9 illustrate an exemplary vibration compensation.

FIG. 9 illustrate an exemplary vibration compensation for an in vivo high b-value DWI in a human brain. FIG. 9A shows an iso DWI of the brain without applying a vibration matching gradient, while FIG. 9B shows an iso DWI of the brain with applying a vibration matching gradient. The measurements are performed using a 32-channel head coil, an DW EPI (echo-planar imaging) with a FOV of 230×230× 114 mm³, a voxel size of 1.5×1.5×4 mm³, a TR of 6070 ms, a TE of 124 ms, and a halfscan factor of 0.7 at a b-value of 10,000 s/mm². It is possible to use the same shortest TE and TR with and without vibration compensation gradient, while the time penalty of the compensation is not severe, i.e., the time increases from 3:20 min to 3:27 min. The effect of applying the vibration matching gradient is visible in particular in the indicated regions 304.

ADC Measurements in Phantoms

To evaluate the performance of the proposed scheme, the lipid ADC value was estimated within the WF phantoms (6,000 and 11,000 rpm). Three different phantoms were utilized in the phantom measurements. For the lipid diffusion property measurements, two WF phantoms with 80% fat fraction were produced (content: 800 ml sun flower oil, 200 ml water, 4 ml Tween80 and 1 g of sodium benzoate). Emulsification was carried out with a colloid mill at 6,000 and 11,000 revolutions per minute (rpm). The obtained phantoms yield different lipid droplet sizes and consequently different viscosities. The experiments were performed on the scanner table and on a decoupling table made of wood that decoupled the sample and the vibrating scanner table. The following two interferometer experiments were performed with the interferometer setup to quantify the effects under investigation. The voxel of interest was placed in the middle of the WF phantom material. The experiment was repeated for the same three different measurement scenarios as performed in the interferometer measurements and with the same scanning parameters. The utilized additional sequence parameters were: 16 averages per b-value (half of the averages with positive and the other half with negative polarity), 1 start-up cycle, b-values: 10,000-20,000-40,000-60,000 s/mm2, 2:48 min scan time per phantom. Diffusion gradients were applied simultaneously in all three axes to minimize TE.

Figure 10:
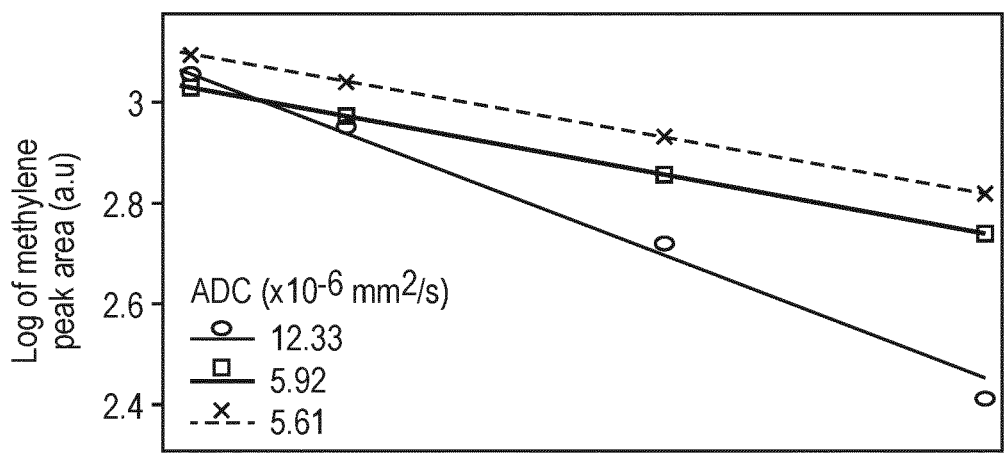
FIG. 10 shows the results from the phantom scans.
Figure 10:
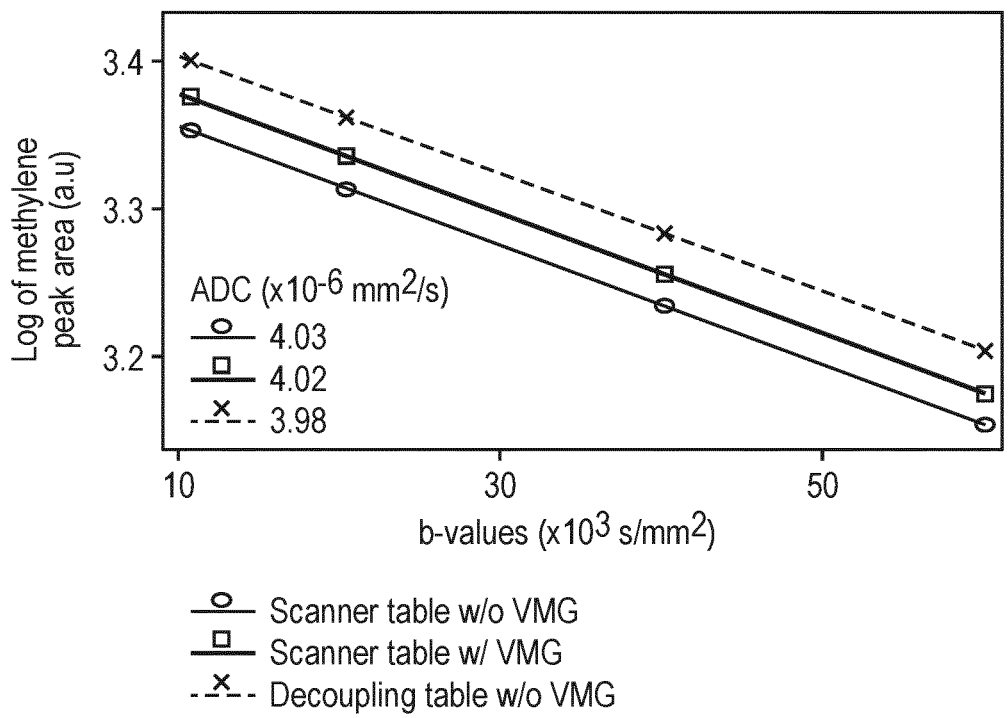

FIG. 10 shows the results from the phantom scans. Assuming that the phantoms on the decoupling table are not affected by vibration artefacts, the ADC value on the decoupling table represents the real lipid ADC value. In the 6,000 rpm phantom, the DW MRS experiment on the scanner table yields to a 119.0% overestimation of the ADC value whereas only a relative error of 5.5% is observed on the scanner table with the VMG. In the 11,000 rpm phantom, the obtained lipid ADC value is very similar between the different measurement scenarios and only relative differences below 1% are observed.

ADC Measurements In Vivo

The bone marrow in the tibia of three healthy volunteers (volunteer 1: 24 years/85 kg; volunteer 2: 29 years/57 kg; volunteer 3: 28 years/80 kg) was scanned using an 8-channel extremity coil without and with the VMG and with different additional weight placed on the scanner table (0/10/20 kg). By changing the loading of the scanner table, the mechanical vibrations were altered and the influence of the vibrations on the DW measurement could be investigated. Each scan was repeated three times to access the reproducibility of the ADC measurement. The DW MRS voxel was placed approximately 1 cm below the growth plate in the tibia bone marrow and was performed with the same parameters as the phantom scans (including the same diffusion directions and b-values). Afterwards, the lipid ADC was extracted for each loading without and with the VMG.

Figure 11:
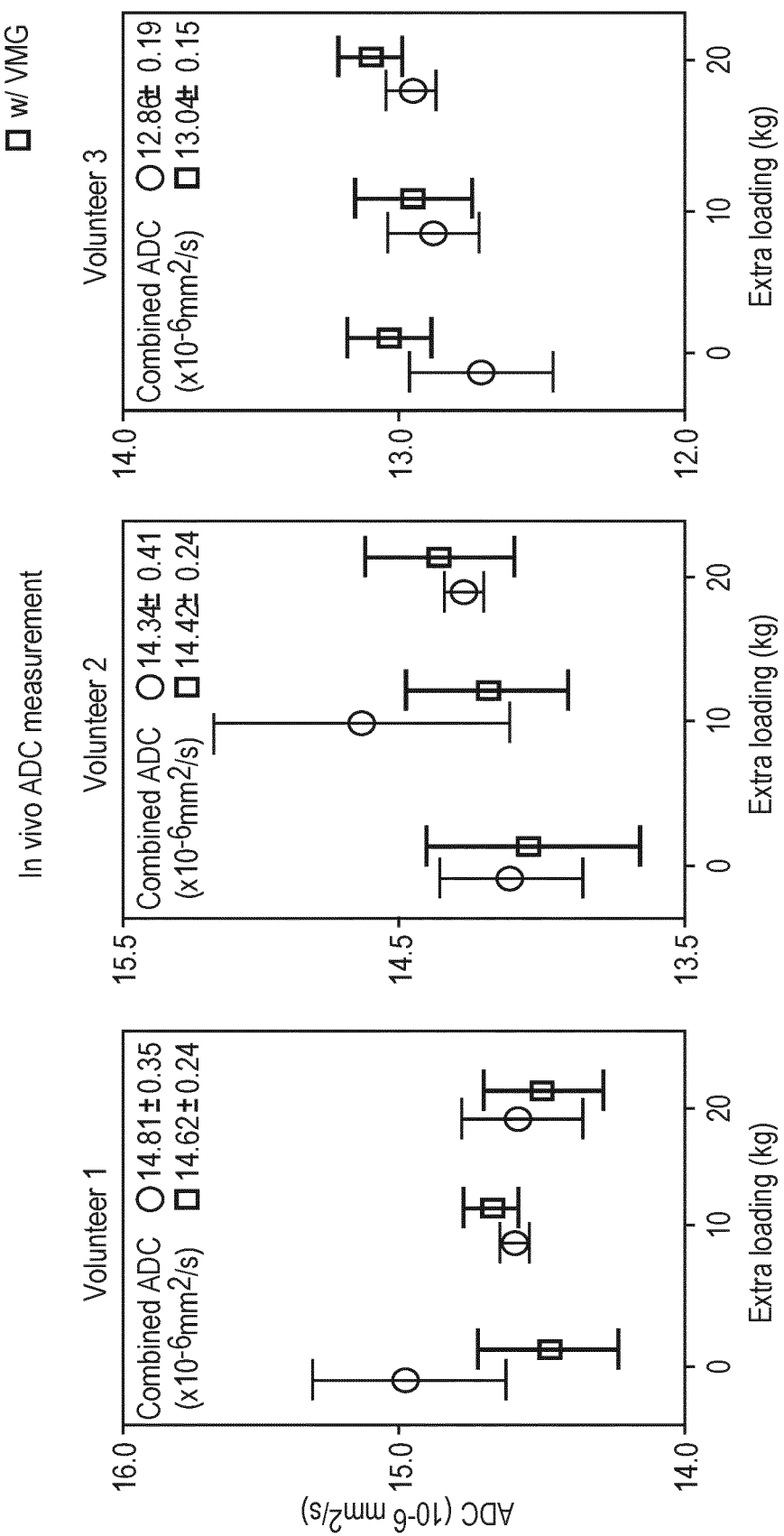
FIG. 11 shows the mean obtained ADC value in the tibia bone marrow.

FIG. 11 shows the mean obtained ADC value in the tibia bone marrow with corresponding standard deviation of the three repeated measurements with different loading of the scanner table. Without the VMG, a dependency of the measured ADC value on the additional loading of the scanner table is observed and a larger standard deviation of the lipid ADC estimation is observed. The ADC value combined from the different measurement is comparable with and without VMG. However, the coefficient of variation is reduced by 34.9% (volunteer 1), 18.9% (volunteer 2) and 24.0% (volunteer 3) in the three volunteers, comparing the measurement without the VMG to the measurement with the VMG.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Ordinal numbers, like e.g. 'first' and 'second', may be used herein to indicate a relative temporal ordering, but not to indicate any absolute temporal ordering. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance system
104 magnet
106 bore of magnet
108 data acquisition volume
109 region of interest
110 magnetic field gradient coils
112 magnetic field gradient coil power supply
114 radio-frequency coil
116 transceiver
118 subject
119 sample
120 subject support
126 computer system
128 hardware interface
130 processor
132 user interface
134 computer memory
140 machine executable instructions
142 waveform and pulse sequence commands
144 magnetic resonance imaging data
146 magnetic resonance images
152 waveform and pulse sequence commands
154 magnetic resonance imaging/spectroscopy data
156 magnetic resonance image/spectrum
200 vibration matching gradient
201 pulse sequence
203 pulse sequence
202 spin manipulating gradient
204 spin manipulating gradient
206 radio frequency pulse
208 radio frequency pulse
210 first vibrations
211 first state of vibration
212 second vibrations
213 second state of vibration
300 2D imaging slice
302 indicated region
304 indicated region
600 generate a vibration matching gradient 602 acquire magnetic resonance data using at least two spin manipulating gradients

The invention claimed is:

1. A magnetic resonance system configured to acquire magnetic resonance data from a subject in a data acquisition volume of the magnetic resonance system, comprising:
a memory configured to store machine executable instructions and a set of waveform and pulse sequence commands, wherein the set of waveform and pulse sequence commands is configured to generate a vibration matching gradient for inducing first vibrations of one or more hardware elements of the magnetic resonance system and/or the subject, while a net magnetization vector of the subject is aligned along a longitudinal axis of a main magnetic field generated by the magnetic resonance system, wherein the set of waveform and pulse sequence commands is further configured to acquire magnetic resonance data from the subject according to a magnetic resonance protocol, wherein the acquiring of the magnetic resonance data comprises generating in sequence at least two spin manipulating gradients for manipulating phases of nuclear spins within the subject, while the net magnetization vector of the subject comprises a non-vanishing component of net magnetization in a transverse plane perpendicular to the longitudinal axis of the main magnetic field,
a processor configured to control the magnetic resonance system, wherein execution of the machine executable instructions causes the processor to control the magnetic resonance system using the set of waveform and pulse sequence commands to
prepare a first state of vibration of the one or more hardware elements and/or the subject, the preparing comprises generating the vibration matching gradient inducing the first vibrations of the one or more hardware elements and/or the subject, while the net magnetization vector of the subject is aligned along the longitudinal axis of the main magnetic field,
acquire the magnetic resonance data according to the magnetic resonance protocol, wherein the acquiring comprises generating in sequence the at least two spin manipulating gradients for manipulating phases of nuclear spins within the subject, while the net magnetization vector of the subject comprises a non-vanishing component in the transverse plane perpendicular to the longitudinal axis of the main magnetic field,
wherein a first one of the at least two spin manipulating gradients is generated during the first state of vibration and a second one of the at least two spin manipulating gradients is generated during a second state of vibration of the one or more hardware elements and/or the subject, wherein the vibration matching gradient is used for matching with the first state of vibration to the second state of vibration.

2. The magnetic resonance system of claim 1, wherein the second state of vibration results from second vibrations induced by the first one of the at least two spin manipulating gradients.

3. He magnetic resonance system of claim 1, wherein the magnetic resonance protocol is sensitive to an accumulation of spin displacement-induced phases with the at least two spin manipulating gradients being used for accumulating spin displacement-induced phases and the acquired magnetic resonance data encoding effects of the accumulated spin displacement-induced phases.

4. The magnetic resonance system of claim 3, wherein the magnetic resonance protocol is one of the following: a diffusion-weighted protocol, an apparent diffusion coefficient protocol, a diffusion tensor imaging protocol, a diffusion-weighted spectroscopy protocol, a diffusion weighted preparation protocol, a higher-order diffusion model protocol, a phase contrast velocimetry protocol, a displacement encoding protocol and an magnetic resonance elastography protocol.

5. The magnetic resonance system of claim 1, wherein the execution of the machine executable instructions further causes the processor to control the magnetic resonance system to compute a representation of the acquired magnetic resonance data.

6. The magnetic resonance system of claim 5, wherein the computing of the representation comprises computing one or more of the following using the acquired magnetic resonance data: a diffusion-weighted magnetic resonance image, an apparent diffusion coefficient map, a diffusion tensor image, an exponential apparent diffusion coefficient map, a fractional anisotropy image, a principal diffusion direction map, a fiber tracking map, a velocity map, a magnetic resonance spectrum, an elastogram and a modeled parameter extracted using a signal model in-cooperating diffusion-weighting, velocity encoding and/or displacement encoding.

7. The magnetic resonance system of claim 1, wherein the one or more hardware elements comprise a supporting element for supporting the subject in the data acquisition volume of the magnetic resonance system.

8. The magnetic resonance system of claim 1, wherein a first time interval between generating the vibration matching gradient and the first one of the at least two spin manipulating gradients equals a second time interval between generating the first one and the second one of the at least two spin manipulating gradients.

9. The magnetic resonance system of claim 1, wherein an amplitude of the vibration matching gradient equals an amplitude of the first one of the at least two spin manipulating gradients.

10. The magnetic resonance system of claim 1, wherein the vibration matching gradient comprises a first waveform and first one of the at least two spin manipulating gradients comprises a second waveform, wherein a slope of a flank of the first waveform equals a slope of a flank of the second waveform.

11. The magnetic resonance system of claim 10, wherein the first waveform equals the second waveform.

12. A computer program product comprising machine executable instructions stored on a non-transitory computer readable medium for execution by a processor controlling a magnetic resonance system configured for acquiring magnetic resonance data from a subject in a data acquisition volume of the magnetic resonance system,
wherein the computer program product further comprises a set of waveform and pulse sequence commands, wherein the set of waveform and pulse sequence commands is configured for generating a vibration matching gradient for inducing first vibrations of one or more hardware elements of the magnetic resonance system and/or the subject, while a net magnetization vector of the subject is aligned along a longitudinal axis of a main magnetic field generated by the magnetic resonance system, wherein the set of waveform and pulse sequence commands is further configured for acquiring magnetic resonance data from the subject according to a magnetic resonance protocol, wherein the acquiring of the magnetic resonance data comprises generating in sequence at least two spin manipulating gradients for manipulating phases of nuclear spins within the subject, while the net magnetization vector of the subject comprises a non-vanishing component of net magnetization in a transverse plane perpendicular to the longitudinal axis of the main magnetic field, and wherein execution of the machine executable instructions causes the processor to control the magnetic resonance system using the set of waveform and pulse sequence commands to prepare a first state of vibration of the one or more hardware elements and/or the subject, the preparing comprises generating the vibration matching gradient inducing the first vibrations of the one or more hardware elements and/or the subject, while the net magnetization vector of the subject is aligned along the longitudinal axis of the main magnetic field, acquire the magnetic resonance data according to the magnetic resonance protocol, wherein the acquiring comprises generating in sequence the at least two spin manipulating gradients for manipulating phases of nuclear spins within the subject, while the net magnetization vector of the subject comprises a non-vanishing component along the transverse plane perpendicular to the longitudinal axis of the main magnetic field, wherein a first one of the at least two spin manipulating gradients is generated during the first state of vibration and a second one of the at least two spin manipulating gradients is generated during a second state of vibration of the one or more hardware elements and/or the subject, wherein the vibration matching gradient is used for matching with the first state of vibration to the second state of vibration.

13. A method for operating a magnetic resonance system configured for acquiring magnetic resonance data from a subject in a data acquisition volume of the magnetic resonance system, the magnetic resonance system comprising:

a memory configured to store machine executable instructions and a set of waveform and pulse sequence commands, wherein the set of waveform and pulse sequence commands is configured for generating a vibration matching gradient for inducing first vibrations of one or more hardware elements of the magnetic resonance system and/or the subject, while a net magnetization vector of the subject is aligned along a longitudinal axis of a main magnetic field generated by the magnetic resonance system, wherein the set of waveform and pulse sequence commands is further configured for acquiring magnetic resonance data from the subject according to a magnetic resonance protocol, wherein the acquiring of the magnetic resonance data comprises generating in sequence at least two spin manipulating gradients for manipulating phases of nuclear spins within the subject, while the net magnetization vector of the subject comprises a non-vanishing component of net magnetization in a transverse plane perpendicular to the longitudinal axis of the main magnetic field, and a processor for controlling the magnetic resonance system, wherein execution of the machine executable instructions causes the processor to control the magnetic resonance system according to the method using the set of waveform and pulse sequence commands, wherein the method comprises:

preparing a first state of vibration of the one or more hardware elements and/or the subject, the preparing comprises generating the vibration matching gradient inducing the first vibrations of the one or more hardware elements and/or the subject, while the net magnetization vector of the subject is aligned along the longitudinal axis of the main magnetic field, acquiring the magnetic resonance data according to the magnetic resonance protocol, wherein the acquiring comprises generating in sequence the at least two spin manipulating gradients for manipulating phases of nuclear spins within the subject, while the net magnetization vector of the subject comprises a non-vanishing component in the transverse plane perpendicular to the longitudinal axis of the main magnetic field, wherein a first one of the at least two spin manipulating gradients is generated during the first state of vibration and a second one of the at least two spin manipulating gradients is generated during a second state of vibration of the one or more hardware elements and/or the subject, wherein the vibration matching gradient is used for matching with the first state of vibration to the second state of vibration.

* * * * *